(12) United States Patent
Jung

(10) Patent No.: US 11,217,640 B2
(45) Date of Patent: Jan. 4, 2022

(54) TRANSPARENT DISPLAY APPARATUS HAVING PARTITION WALLS

(71) Applicant: LG Display Co., Ltd., Seoul (KR)

(72) Inventor: Hyunju Jung, Incheon (KR)

(73) Assignee: LG Display Co., Ltd., Seoul (KR)

( * ) Notice: Subject to any disclaimer, the term of this patent is extended or adjusted under 35 U.S.C. 154(b) by 8 days.

(21) Appl. No.: 16/134,610

(22) Filed: Sep. 18, 2018

(65) Prior Publication Data
US 2019/0131365 A1 May 2, 2019

(30) Foreign Application Priority Data
Oct. 31, 2017 (KR) .......................... 10-2017-0143982

(51) Int. Cl.
*H01L 27/32* (2006.01)
*H01L 51/52* (2006.01)
*H01L 27/12* (2006.01)

(52) U.S. Cl.
CPC ........ *H01L 27/3246* (2013.01); *H01L 27/326* (2013.01); *H01L 27/3262* (2013.01); *H01L 27/3265* (2013.01); *H01L 51/5212* (2013.01); *H01L 51/5228* (2013.01); *H01L 51/5246* (2013.01); *H01L 51/5253* (2013.01); *H01L 27/1255* (2013.01); *H01L 27/322* (2013.01)

(58) Field of Classification Search
CPC ............... H01L 27/3246; H01L 27/326; H01L 51/5212; H01L 51/5228; H01L 51/525; G02F 1/13394
See application file for complete search history.

(56) References Cited

U.S. PATENT DOCUMENTS

| | | | | |
|---|---|---|---|---|
| 6,538,374 B2 * | 3/2003 | Hosokawa | .......... | H01L 51/5206 313/504 |
| 7,834,543 B2 * | 11/2010 | Takata | ................ | H01L 27/3246 313/498 |
| 8,610,344 B2 * | 12/2013 | Matsuda | ............... | G03F 7/0035 313/498 |
| 9,111,887 B2 * | 8/2015 | Kim | ..................... | H01L 27/3246 |
| 9,337,244 B2 * | 5/2016 | Hatano | ................ | H01L 51/525 |
| 10,468,469 B2 * | 11/2019 | Tsai | ...................... | G06F 3/0412 |
| 2012/0049206 A1 * | 3/2012 | Choi | ..................... | H01L 27/326 257/88 |
| 2012/0217516 A1 * | 8/2012 | Hatano | ................ | H01L 51/525 257/88 |

(Continued)

FOREIGN PATENT DOCUMENTS

CN 103094487 A 5/2013
CN 106932928 A 7/2017
(Continued)

*Primary Examiner* — Jesse Y Miyoshi
(74) *Attorney, Agent, or Firm* — Seed IP Law Group LLP

(57) ABSTRACT

Disclosed is a transparent display apparatus. The transparent display apparatus includes a first substrate including a plurality of pixel areas, a first partition wall surrounding each of the plurality of pixel areas, a filling layer covering the first partition wall and the plurality of pixel areas, and a second substrate coupled to the filling layer. Accordingly, a stress applied to a display panel is reduced, and the peeling of an organic light emitting device and transmission of water are preventing from being spread, thereby enhancing the reliability of the display panel.

17 Claims, 8 Drawing Sheets

(56) References Cited

U.S. PATENT DOCUMENTS

| | | | |
|---|---|---|---|
| 2012/0228603 A1* | 9/2012 | Nakamura | H01L 51/5234 257/40 |
| 2013/0112955 A1* | 5/2013 | Yamazaki | H01L 51/5228 257/40 |
| 2014/0183479 A1* | 7/2014 | Park | H01L 51/56 257/40 |
| 2016/0260787 A1* | 9/2016 | Kim | H01L 27/3246 |
| 2017/0162636 A1 | 6/2017 | Park et al. | |
| 2017/0221976 A1* | 8/2017 | Park | H01L 27/326 |

FOREIGN PATENT DOCUMENTS

| | | |
|---|---|---|
| KR | 10-2010-0079096 A | 7/2010 |
| KR | 10-1448938 B1 | 10/2014 |

\* cited by examiner

TRANSPARENT DISPLAY APPARATUS HAVING PARTITION WALLS

CROSS-REFERENCE TO RELATED APPLICATIONS

This application claims the benefit of the Korean Patent Application No. 10-2017-0143982 filed on Oct. 31, 2017, which is hereby incorporated by reference as if fully set forth herein.

BACKGROUND

Technical Field

The present disclosure relates to a transparent display apparatus.

Description of the Related Art

Display apparatuses are being widely used as a display screen of notebook computers, tablet computers, smartphones, portable display apparatuses, and portable information devices in addition to a display screen of televisions (TVs) or monitors.

Liquid crystal display (LCD) apparatuses and organic light emitting display (OLED) apparatuses display an image by using thin film transistors (TFTs) as switching elements. Since the LCD apparatuses do not self-emit light, the LCD apparatuses display an image by using light emitted from a backlight unit which is disposed under a liquid crystal display panel. Since the LCD apparatuses include the backlight unit, there is a limitation in design, and luminance and response time are reduced.

Since organic light emitting display apparatuses include an organic material, the organic light emitting display apparatuses are vulnerable to water, and due to this, are reduced in reliability and lifetime. Recently, transparent display apparatuses which display an image without hindering a field of view because light passes through a front surface and a rear surface are being developed.

For example, research for applying organic light emitting display apparatuses to transparent display apparatuses is being done. The organic light emitting display apparatuses are classified into a top emission type, a bottom emission type, and a dual emission type, based on a direction in which light is irradiated.

In a related art transparent display apparatus, an interface stress occurs in a laser release process to cause a crack, and since a water transmission path occurs, water and particles penetrate into the inside, causing the damage of an organic light emitting device. Also, in the related art transparent display apparatus, when the organic light emitting device is damaged by heat, peeling occurs, and peeling which occurs in a portion of the organic light emitting device is spread to a peripheral region. In this case, the peeling of the organic light emitting device is spread to a peripheral region by an additional external weak impact and is finally spread to a whole area of a display panel.

BRIEF SUMMARY

Accordingly, the present disclosure is directed to provide a transparent display apparatus that substantially obviates one or more problems due to limitations and disadvantages of the related art.

An aspect of the present disclosure is directed to provide a transparent display apparatus in which a partition wall surrounds each of a plurality of pixel areas to decrease a stress applied to a display panel and to prevent the peeling of an organic light emitting device and transmission of water from being spread, thereby enhancing the reliability of the display panel.

Another aspect of the present disclosure is directed to provide a transparent display apparatus in which a rigidity of the transparent display apparatus is complemented by using first and second partition walls each including a reverse tapered structure.

Another aspect of the present disclosure is directed to provide a transparent display apparatus in which since a partition wall surrounds each of a plurality of pixel areas, an organic light emitting device is patterned without adding a mask, and peeling and a dark spot are prevented from being spread, thereby minimizing a defect of each pixel.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a transparent display apparatus including a first substrate including a plurality of pixel areas, a first partition wall surrounding each of the plurality of pixel areas, a filling layer covering the first partition wall and the plurality of pixel areas, and a second substrate coupled to the filling layer.

Details of other embodiments are included in the detailed description and the drawings.

It is to be understood that both the foregoing general descriptions and the following detailed descriptions of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
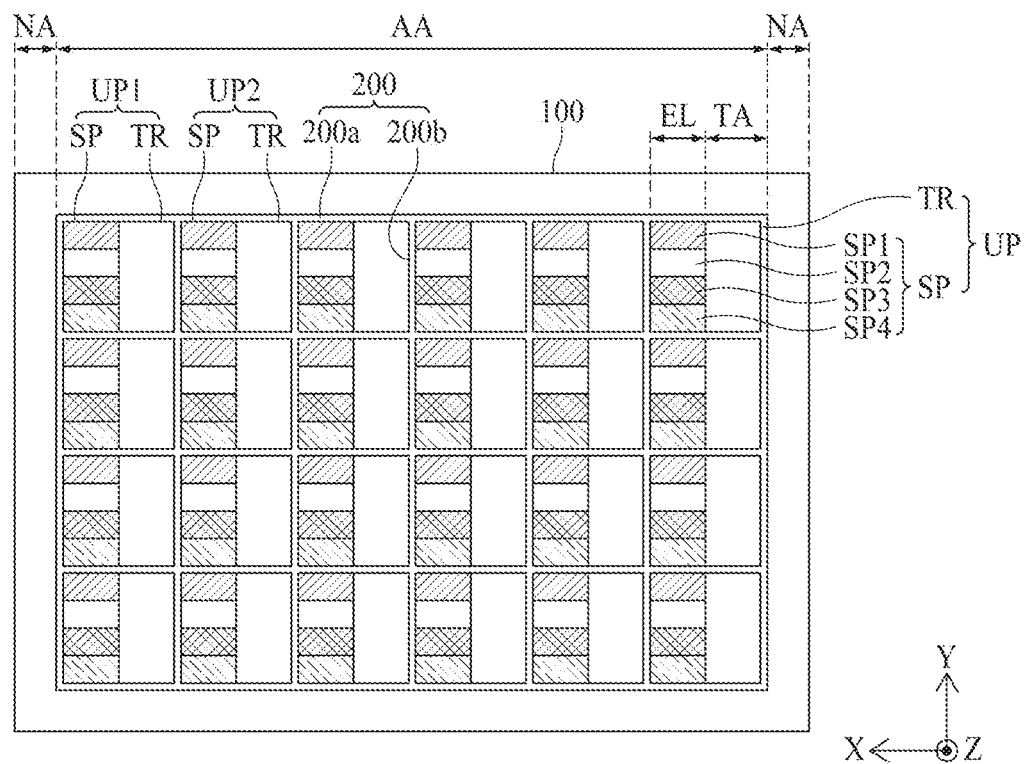
FIG. 1 is a plan view illustrating a transparent display apparatus according to a first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc., may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Therefore, in the present disclosure, examples of the display apparatus may include a narrow-sense display apparatus itself, such as a liquid crystal module (LCM) or an organic light emitting display (OLED) module, and a set device which is a final consumer device or an application product including the LCM or the OLED module.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like).

Moreover, the display panel may further include a backing such as a metal plate attached on the display panel. However, the present embodiment is not limited to the metal plate, and the display panel may include another structure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a plan view illustrating a transparent display apparatus according to a first embodiment of the present disclosure.

Referring to FIG. 1, the transparent display apparatus according to the first embodiment of the present disclosure may include a first substrate 100, a plurality of unit pixels UP, and a partition wall 200.

The first substrate 100, a base substrate, may be a transparent flexible substrate capable of being curved or bent. According to an embodiment, the first substrate 100 may include transparent polyimide, but without being limited thereto, the first substrate 100 may be formed of a transparent plastic material such as polyethylene terephthalate. Also, considering a high temperature deposition process, the first substrate 100 including polyimide may use polyimide which endures a high temperature and is good in heat resistance. For example, the first substrate 100 including transparent polyimide may be formed by hardening polyimide resin which is coated to have a certain thickness on a front surface of a release layer provided on a carrier glass substrate. The carrier glass substrate 100 may be separated from the first substrate 100 through a laser release process along the release layer.

According to an embodiment, the first substrate 100 may be a glass substrate. For example, the first substrate 100 may include silicon dioxide ($SiO_2$) or oxide aluminum ($Al_2O_3$) as a main component.

The first substrate 100 may include a display area AA and a non-display area NA. The display area AA may be an area on which an image is displayed, and may be defined in a center of the first substrate 100. Here, the display area AA may correspond to an active area of each of a plurality of unit pixels UP. For example, the display area AA may include the plurality of unit pixels UP respectively provided in a plurality of pixel areas defined by intersections of a plurality of gate lines (not shown) and a plurality of data lines (not shown).

The first substrate 100 may include the plurality of pixel areas. Here, each of the plurality of pixel areas may correspond to one unit pixel UP. In detail, each of the plurality of unit pixels UP (or the plurality of pixel areas) may include a plurality of subpixels SP and a transmission part TR. Therefore, the first substrate 100 may include a plurality of pixel areas equal to the number of unit pixels UP. Also, each of the plurality of unit pixels UP may be defined as an emission part EL and a transmissive area TA. Here, the plurality of subpixels SP may be provided in the emission part EL, and the transmission part TR may be provided in the transmissive area TA. Each of the plurality of subpixels SP may be defined as a minimum unit area which emits light. Each of the plurality of unit pixels UP may include at least three subpixels SP adjacent to one another. For example, the plurality of subpixels SP may include a red subpixel, a green subpixel, and a blue subpixel. Furthermore, the plurality of subpixels SP may further include a white subpixel.

According to an embodiment, the plurality of subpixels SP may include first to fourth subpixels SP1 to SP4. Here, each of the first to fourth subpixels SP1 to SP4 may correspond to one of the red subpixel, the green subpixel, the blue subpixel, and the white subpixel. The plurality of subpixels SP may be spaced apart from one another in a first direction X and may be alternately arranged in a second direction Y. Therefore, the plurality of subpixels SP may be provided in the emission part EL among the emission part EL and the transmissive area TA which are alternately arranged in the first direction X.

The transmissive area TA may be defined by the partition wall 200 or a black matrix, and the transmission part TR may be provided in the transmissive area TA. The transmission part TR may be provided in each of the plurality of unit pixels UP, and thus, a partial region of each of the unit pixels UP may be transparent, thereby increasing a transparency of each unit pixel UP.

According to an embodiment, the transmission part TR may be provided in parallel with and adjacent to four subpixels SP provided in the emission part EL. For example, a size of the transmission part TR may be set to a half region of each unit pixel UP, but is not limited thereto, may be changed based on transparency set in each unit pixel UP. Therefore, the transmissive area TR may not include a thin film transistor (TFT) and a color filter. That is, the TFT and the color filter may be provided in the emission part EL.

The non-display area NA may be an area on which an image is not displayed, and may be defined in an edge of the first substrate 100 surrounding the display area AA. The non-display area NA may include a pad part and a circuit film electrically connected to the pad part.

The partition wall 200 may surround each of the plurality of unit pixels UP. That is, each of the plurality of unit pixels UP may be defined by the partition wall 200. Each of the plurality of unit pixels UP may include the plurality of subpixels SP and the transmission part TR. Also, each of the plurality of unit pixels UP may be defined as the emission part EL and the transmissive area TA. Here, the plurality of subpixels SP may be provided in the emission part EL, and the transmission part TR may be provided in the transmissive area TA. Therefore, the partition wall 200 may surround each of the plurality of unit pixels UP to isolate the plurality of unit pixels UP.

According to an embodiment, a plurality of subpixels SP and a transmission part TR of one unit pixel UP may be separated from a plurality of subpixels SP and a transmission part TR of one other unit pixel UP by the partition wall 200. For example, the plurality of unit pixels UP may include first and second unit pixels UP1 and UP2 which are adjacent to each other in the first direction X. Also, the partition wall 200 may surround each of the first and second unit pixels UP1 and UP2. In detail, the partition wall 200 may surround upper ends of the plurality of subpixels SP and the transmission part TR, left ends of the plurality of subpixels SP, a right end of the transmission part TR, and lower ends of the plurality of subpixels SP and the transmission part TR. Therefore, the partition wall 200 may be disposed between a transmission part TR of the first unit pixel UP1 and a plurality of subpixels SP of the second unit pixel UP2. As a result, in the transparent display apparatus according to an embodiment of the present disclosure, the partition wall 200 may surround each of the plurality of unit pixels UP to decrease a stress applied to the display panel and to prevent peeling and penetration of water, which occur in one unit pixel UP, from being spread to other unit pixels UP. As described above, the transparent display apparatus according to an embodiment of the present disclosure prevents the peeling of the organic light emitting device and transmission of water from being spread, thereby minimizing a defect of each pixel and enhancing the reliability of the transparent display apparatus.

The partition wall 200 may have a reverse tapered structure where an upper width is wider than a lower width. Also, the partition wall 200 may include a first axis partition wall 200a and a second axis partition wall 200b, which have different widths and heights.

The first axis partition wall 200a may extend in the first direction X of the first substrate 100 and may be spaced apart from an adjacent first axis partition wall 200a in the second direction Y perpendicularly intersecting the first direction X. According to an embodiment, the first axis partition wall 200a may be provided wider in width than and lower in height than the second axis partition wall 200b. Also, the second axis partition wall 200b may extend in the second direction Y and may be spaced apart from an adjacent second axis partition wall 200b in the first direction X. According to an embodiment, the second axis partition wall 200b may be provided narrower in width than and higher in height than the first axis partition wall 200a. For example, in the transparent display apparatus according to the present embodiment, a length of the first direction X may be set longer than that of the second direction Y, and the transparent flexible substrate may be used, whereby the transparent display apparatus may be rolled or bent. Generally, when the transparent display apparatus is rolled or bent in the second direction Y, a stress occurs in the display panel along the second direction Y. Accordingly, since the first axis partition wall 200a is provided wider in width than and lower in height than the second axis partition wall 200b and the second axis partition wall 200b is provided narrower in width than and higher in height than the first axis partition wall 200a, a stress occurring when the transparent display apparatus is rolled or bent is reduced, and thus, rigidity is complemented, thereby preventing the peeling of the organic light emitting device. As a result, a width d1 and a height d2 of the first axis partition wall 200a (see FIG. 6A) and a width d3 and a height d4 of the second axis partition wall 200b may be adjusted in the partition wall 200 (see FIG. 6B), and thus, stresses which are applied to the transparent display apparatus in various directions are reduced, thereby more complementing rigidity.

According to an embodiment, the first axis partition wall 200a and the second axis partition wall 200b may surround each of the plurality of unit pixels UP to isolate the plurality of unit pixels UP. As a result, since the transparent display apparatus according to the present embodiment includes the first axis partition wall 200a having a wide width and the second axis partition wall 200b having a high height, a stress occurring when the transparent display apparatus is rolled or bent is reduced, and rigidity is complemented, thereby enhancing reliability.

Figure 2:
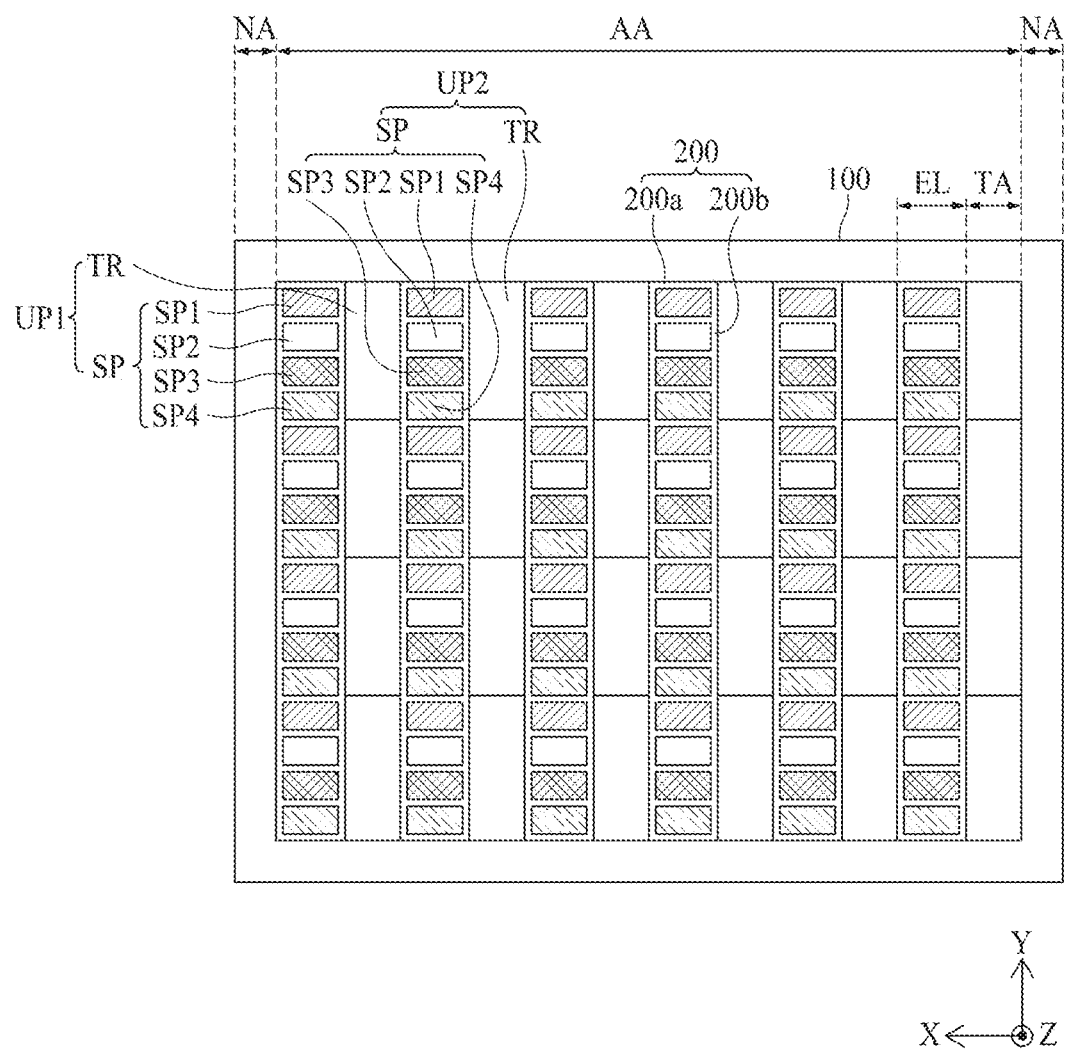
FIG. 2 is a plan view illustrating a transparent display apparatus according to a second embodiment of the present disclosure.

FIG. 2 is a plan view illustrating a transparent display apparatus according to a second embodiment of the present disclosure. The transparent display apparatus according to the second embodiment of the present disclosure may be implemented by modifying a configuration of a partition wall 200 in comparison with the first embodiment. Hereinafter, the configuration of the partition wall 200 will be mainly described, and overlapping descriptions of other elements are omitted or will be briefly given.

Referring to FIG. 2, the transparent display apparatus according to the second embodiment of the present disclosure may include a first substrate 100, a plurality of unit pixels UP, and a partition wall 200.

The first substrate 100 may include a plurality of pixel areas. Here, each of the plurality of pixel areas may correspond to one subpixel SP. In detail, each of the plurality of unit pixels UP may include a plurality of subpixels SP (or a plurality of pixel areas) and a transmission part TR. Also, each of the plurality of unit pixels UP may be defined as an emission part EL and a transmissive area TA. Here, the plurality of subpixels SP (or the plurality of pixel areas) may be provided in the emission part EL, and the transmission part TR may be provided in the transmissive area TA. Therefore, each of the plurality of subpixels SP (or the plurality of pixel areas) may be defined as a minimum unit area which emits light. Each of the plurality of unit pixels UP may include at least three subpixels SP adjacent to one another. For example, the plurality of subpixels SP may include a red subpixel, a green subpixel, and a blue subpixel. Furthermore, the plurality of subpixels SP may further include a white subpixel. Therefore, the first substrate 100 may include a plurality of pixel areas equal to the number of subpixels SP.

According to an embodiment, the plurality of subpixels SP may include first to fourth subpixels SP1 to SP4. Here, each of the first to fourth subpixels SP1 to SP4 may correspond to one of the red subpixel, the green subpixel, the blue subpixel, and the white subpixel. The plurality of subpixels SP may be spaced apart from one another in a first direction X and may be alternately arranged in a second direction Y. Therefore, the plurality of subpixels SP may be provided in the emission part EL among the emission part EL and the transmissive area TA which are alternately arranged in the first direction X.

The transmissive area TA may be defined by the partition wall 200 or a black matrix, and the transmission part TR may be provided in the transmissive area TA. The transmission part TR may be provided in each of the plurality of unit pixels UP, and thus, a partial region of each of the unit pixels UP may be transparent, thereby increasing a transparency of each unit pixel UP.

The partition wall 200 may surround each of the plurality of subpixels SP. That is, each of the plurality of subpixels SP may be defined by the partition wall 200. Each of the plurality of unit pixels UP may include the plurality of subpixels SP and the transmission part TR. Also, each of the plurality of unit pixels UP may be defined as the emission part EL and the transmissive area TA. Here, the plurality of subpixels SP may be provided in the emission part EL, and the transmission part TR may be provided in the transmissive area TA. Therefore, the partition wall 200 may surround each of the plurality of subpixels SP, and thus, may isolate the plurality of subpixels SP and may isolate the plurality of subpixels SP from the transmission part TR.

According to an embodiment, one subpixel SP of one unit pixel UP may be separated from another subpixel SP, a transmission part TR, and a subpixel of another unit pixel UP by the partition wall 200. For example, the plurality of unit pixels UP may include first and second unit pixels UP1 and UP2 which are adjacent to each other in the first direction X. Also, the partition wall 200 may surround first to fourth subpixels SP1 to SP4 of each of the first and second unit pixels UP1 and UP2. Therefore, a transmission part TR of the first unit pixel UP1 may be disposed between a partition wall 200 surrounding each of the first to fourth subpixels SP1 to SP4 of the first unit pixel UP1 and a partition wall 200 surrounding each of the first to fourth subpixels SP1 to SP4 of the second unit pixel UP2. As a result, in the transparent display apparatus according to the present embodiment, the partition wall 200 may surround each of the plurality of subpixels SP to decrease a stress applied to the display panel and to prevent peeling and penetration of water, which occur in one subpixel SP, from being spread to other subpixels SP or the transmission part TR. As described above, the transparent display apparatus according to the present embodiment reduces a stress applied to the display panel and prevents the peeling of the organic light emitting device and transmission of water from being spread, thereby minimizing a defect of each pixel and enhancing the reliability of the transparent display apparatus.

The partition wall 200 may have a reverse tapered structure where an upper width is wider than a lower width. Also, the partition wall 200 may include a first axis partition wall 200a and a second axis partition wall 200b, which have different widths and heights. A configuration of each of the first axis partition wall 200a and the second axis partition wall 200b is the same as a configuration described above with reference to FIG. 1.

According to an embodiment, the first axis partition wall 200a and the second axis partition wall 200b may surround each of the plurality of subpixels SP to isolate the plurality of subpixels SP. As a result, since the transparent display apparatus according to the present embodiment includes the first axis partition wall 200a having a wide width and the second axis partition wall 200b having a high height, a stress occurring when the transparent display apparatus is rolled or bent is reduced, and rigidity is complemented, thereby enhancing reliability.

Figure 3:
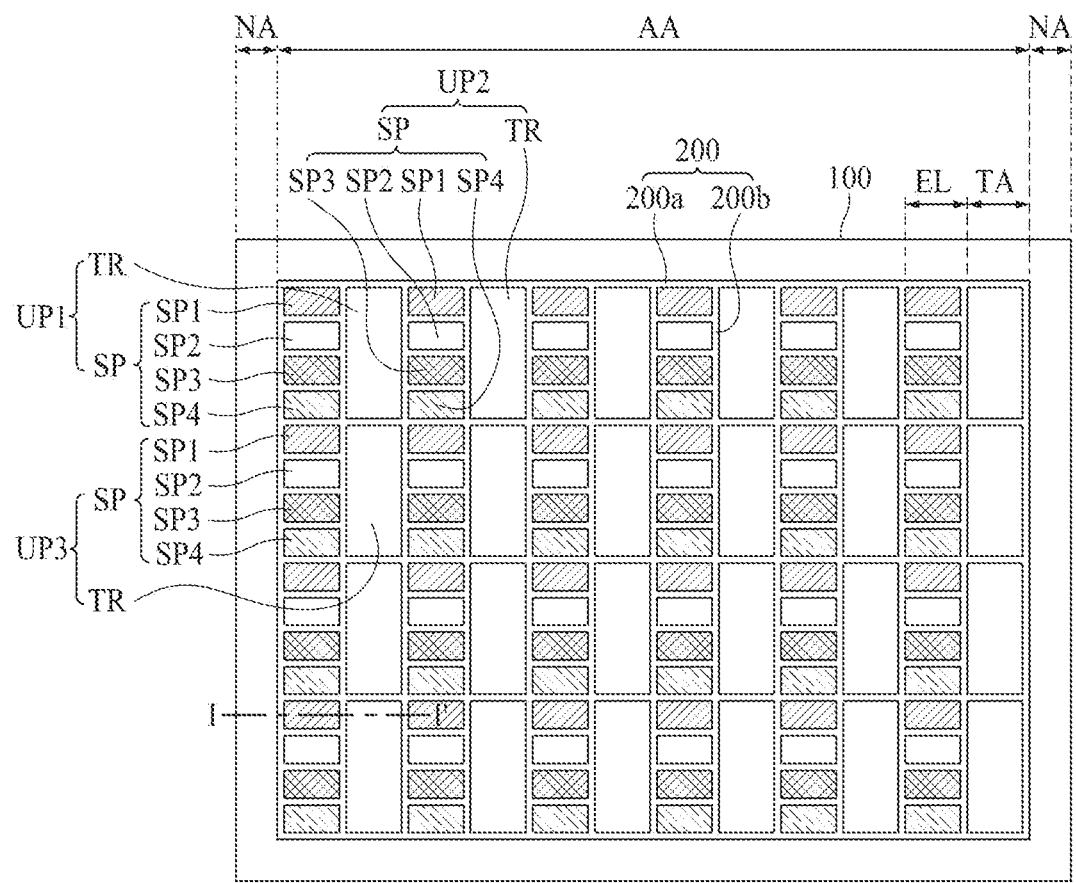
FIG. 3 is a plan view illustrating a transparent display apparatus according to a third embodiment of the present disclosure.

FIG. 3 is a plan view illustrating a transparent display apparatus according to a third embodiment of the present disclosure. The transparent display apparatus according to the third embodiment of the present disclosure may be implemented by modifying a configuration of a partition wall 200 in comparison with the first and second embodiments. Hereinafter, the configuration of the partition wall 200 will be mainly described, and overlapping descriptions of other elements are omitted or will be briefly given.

Referring to FIG. 3, the transparent display apparatus according to the third embodiment of the present disclosure may include a first substrate 100, a plurality of unit pixels UP, and a partition wall 200.

The first substrate 100 may include a plurality of pixel areas. Here, each of the plurality of pixel areas may correspond to one subpixel SP or a transmission part TR. In detail, each of the plurality of unit pixels UP may include a plurality of pixel areas. Here, each of the plurality of pixel areas may correspond to a subpixel SP or a transmission part TR. Also, each of the plurality of unit pixels UP may be defined as an emission part EL and a transmissive area TA. Here, the plurality of subpixels SP may be provided in the emission part EL, and the transmission part TR may be provided in the transmissive area TA. Therefore, each of the plurality of pixel areas may be provided in the emission part EL or the transmissive area TA. Each of the plurality of unit pixels UP may include at least three subpixels SP adjacent to one another. For example, the plurality of subpixels SP may include a red subpixel, a green subpixel, and a blue subpixel. Furthermore, the plurality of subpixels SP may further include a white subpixel. Therefore, the first substrate 100 may include a plurality of pixel areas equal to a sum of the number of subpixels SP and the number of transmission parts TR.

According to an embodiment, the plurality of subpixels SP may include first to fourth subpixels SP1 to SP4. Here, each of the first to fourth subpixels SP1 to SP4 may correspond to one of the red subpixel, the green subpixel, the blue subpixel, and the white subpixel. The plurality of subpixels SP may be spaced apart from one another in a first direction X and may be alternately arranged in a second direction Y. Therefore, the plurality of subpixels SP may be provided in the emission part EL among the emission part EL and the transmissive area TA which are alternately arranged in the first direction X.

The transmissive area TA may be defined by the partition wall 200 or a black matrix, and the transmission part TR may be provided in the transmissive area TA. The transmission part TR may be provided in each of the plurality of unit pixels UP, and thus, a partial region of each of the unit pixels UP may be transparent, thereby increasing a transparency of each unit pixel UP.

The partition wall 200 may individually surround each of the plurality of subpixels SP and the transmission part TR. Also, each of the plurality of unit pixels UP may be defined as the emission part EL and the transmissive area TA. Here, the plurality of subpixels SP may be provided in the emission part EL, and the transmission part TR may be provided in the transmissive area TA. Therefore, the partition wall 200 may individually surround each of the plurality of subpixels SP and the transmission part TR, and thus, may isolate each of the plurality of subpixels SP and each of a plurality of transmission parts TR.

According to an embodiment, one subpixel SP of one unit pixel UP may be separated from another subpixel SP and a subpixel SP of another unit pixel UP by the partition wall 200. Also, a transmission part TR of one unit pixel UP may be separated from a plurality of subpixels SP and a plurality of subpixels SP and a transmissive part TR of another unit pixel UP by the partition wall 200. For example, the plurality of unit pixels UP may include first and second unit pixels UP1 and UP2, which are adjacent to each other in the first direction X, and first and third unit pixels UP1 and UP3 which are adjacent to each other in the second direction Y. Also, the partition wall 200 may individually surround each of first to fourth subpixels SP1 to SP4 and a transmissive part TR of each of the first to third unit pixels UP1 to UP3. Therefore, the transmission part TR of the first unit pixel UP1 may be disposed between a partition wall 200 surrounding each of the first to fourth subpixels SP1 to SP4 of the first unit pixel UP1 and a partition wall 200 surrounding each of the first to fourth subpixels SP1 to SP4 of the second unit pixel UP2, and may be separated from the transmission part TR of the third unit pixel UP3 by a partition wall 200 surrounding an upper end of the transmission part TR of the third unit pixel UP3. As a result, in the transparent display apparatus according to the present embodiment, the partition wall 200 may surround each of the plurality of subpixels SP and the transmission part TR, thereby preventing peeling and penetration of water, which occur in one transmission part TR, from being spread to other subpixels SP or transmission parts TR. As described above, the transparent display apparatus according to the present embodiment reduces a stress applied to the display panel and prevents the peeling of the organic light emitting device and transmission of water from being spread, thereby minimizing a defect of each pixel and enhancing the reliability of the transparent display apparatus.

The partition wall 200 may have a reverse tapered structure where an upper width is wider than a lower width. Also, the partition wall 200 may include a first axis partition wall 200a and a second axis partition wall 200b, which have different widths and heights. A configuration of each of the first axis partition wall 200a and the second axis partition wall 200b is the same as a configuration described above with reference to FIG. 1.

According to an embodiment, the first axis partition wall 200a and the second axis partition wall 200b may individually surround each of the plurality of subpixels SP and each of a plurality of transmission parts TR to isolate the plurality of subpixels SP and the plurality of transmission parts TR. As a result, since the transparent display apparatus according to the present embodiment includes the first axis partition wall 200a having a wide width and the second axis partition wall 200b having a high height, an adhesive force and a frictional force with a filling layer 540 increase to stably support the filling layer 540, a stress occurring when the transparent display apparatus is rolled or bent is reduced, and rigidity is complemented, thereby enhancing reliability.

Figure 4:
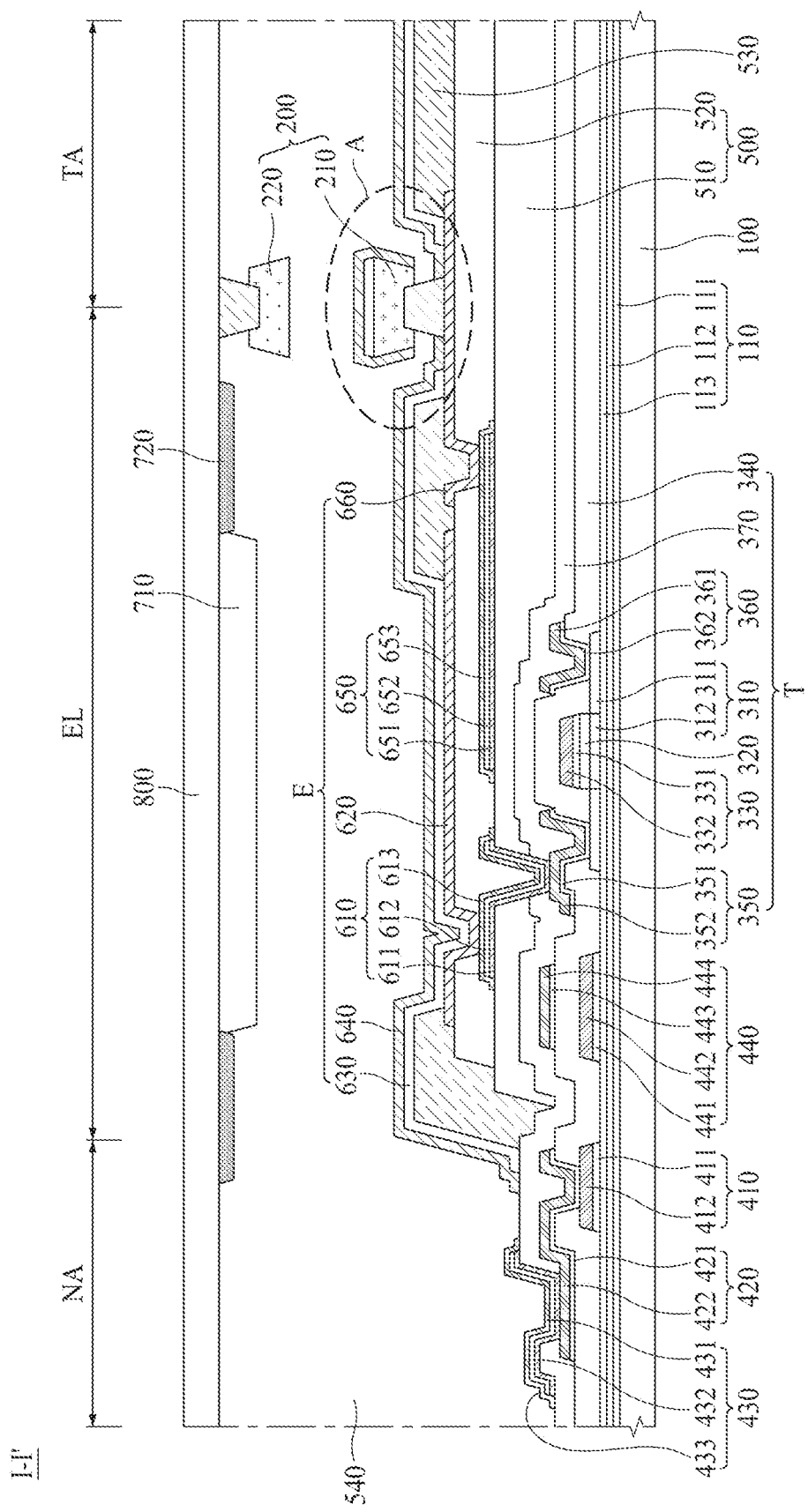
FIG. 4 is a cross-sectional view taken along line I-I' illustrated in FIG. 3.

FIG. 4 is a cross-sectional view taken along line I-I' illustrated in FIG. 3.

Referring to FIG. 4, a transparent display apparatus according to an embodiment of the present disclosure may include a first substrate 100, a multi-buffer layer 110, a partition wall 200, a TFT T, a signal pad 410, a first auxiliary electrode 420, a pad electrode 430, a storage capacitor 440, a first planarization layer 510, a second planarization layer 520, a bank 530, a filling layer 540, an organic light emitting device E, a color filter 710, a black matrix 720, and a second substrate 800.

The first substrate 100, a base substrate, may be a transparent flexible substrate capable of being curved or bent. According to an embodiment, the first substrate 100 may include transparent polyimide, but without being limited thereto, the first substrate 100 may be formed of a transparent plastic material such as polyethylene terephthalate. Also, considering a high temperature deposition process, the first substrate 100 including polyimide may use polyimide which endures a high temperature and is good in heat resistance.

According to an embodiment, the first substrate 100 may be a glass substrate. For example, the first substrate 100 may include silicon dioxide ($SiO_2$) or oxide aluminum ($Al_2O_3$) as a main component.

The multi-buffer layer 110 may be provided on the first substrate 100. The multi-buffer layer 110 may be provided on a whole front surface of the first substrate 100, for preventing water from penetrating into the organic light emitting device E via the first substrate 100. The multi-buffer layer 110 may be formed by stacking a plurality of inorganic layers.

The multi-buffer layer 110 may include a first buffer layer 111, a second buffer layer 112, and a third buffer layer 113.

The first buffer layer 111 may be provided on the first substrate 100. The first buffer layer 111 may be a metal buffer layer. For example, the first buffer layer 111 may be formed of silicon oxide ($SiO_x$), silicon nitride ($SiN_x$), silicon oxynitride (SiON), and/or the like.

The second buffer layer 112 may be provided on the first buffer layer 111. The second buffer layer 112 may be a metal buffer layer and may be formed of a material which is the same as or different from that of the first buffer layer 111.

The third buffer layer 113 may be provided on the second buffer layer 112. The third buffer layer 113 may be a metal buffer layer and may be formed of a material which is the same as or different from that of the first buffer layer 111 or the second buffer layer 112. Therefore, the multi-buffer layer 110 may include a plurality of buffer layers disposed on the first substrate 100, and thus, may prevent water from penetrating into the organic light emitting device E, thereby enhancing a water vapor transmission rate (WVTR) of the transparent display apparatus.

The partition wall 200 may include a first partition wall 210 and a second partition wall 220.

The first partition wall 210 may be disposed on the second planarization layer 520 and may protrude to the second substrate 800. For example, after a deposition of the fourth auxiliary electrode 660 is completed, the first partition wall 210 may be provided on the fourth auxiliary electrode 660. Also, after the first partition wall 210 is formed, an organic light emitting layer 630 and a cathode electrode 640 may be sequentially stacked on an upper surface of the first partition wall 210. At this time, the first partition wall 210 may protrude from the fourth auxiliary electrode 660 to the second substrate 800, and thus, the organic light emitting layer 630 and the cathode electrode 640 provided in each of a plurality of pixel areas adjacent to each other may be separated from each other by the first partition wall 210. Therefore, in the transparent display apparatus according to the present embodiment, the organic light emitting layer 630 and the cathode electrode 640 may be easily patterned without a separate mask process. Here, the cathode electrode 640 may surround an upper surface and a side surface of each of the first partition wall 210 and the organic light emitting layer 630. Also, the first partition wall 210 may be spaced apart from the bank 530 by a certain distance, and the fourth auxiliary electrode 660 may contact the cathode electrode 640 through a separation space between the first partition wall 210 and the bank 530.

In detail, when the organic light emitting layer 630 is being deposited, the upper surface of the first partition wall 210 may act as eaves, and the first partition wall 210 may prevent the organic light emitting layer 630 from being deposited in a region under the eaves. Therefore, when the upper surface of the first partition wall 210 is disposed to overlap the separation space between the first partition wall 210 and the bank 530, the organic light emitting layer 630 may not penetrate into the separation space between the first partition wall 210 and the bank 530, and the fourth auxiliary electrode 660 may be exposed through the separation space between the first partition wall 210 and the bank 530. Here, the organic light emitting layer 630 may be formed through a deposition process where a linearity of a deposition material is good like an evaporation process, the organic light emitting layer 630 may not be deposited in the separation space between the first partition wall 210 and the bank 530 through the deposition process. As a result, in the transparent display apparatus according to the present embodiment, since the first partition wall 210 is provided, the organic light emitting layer 630 and the cathode electrode 640 may be formed so as to be separated from each other in each of a plurality of pixel areas without a separate mask process.

Moreover, the first partition wall 210 may be formed so that an upper width of the first partition wall 210 is wider than a lower width of the first partition wall 210, in order to act as eaves. According to an embodiment, the first partition wall 210 may include a lower partition wall and an upper partition wall. The lower partition wall may be provided on the fourth auxiliary electrode 660 and may be formed of the same material as that of the bank 530 through the same process. The upper partition wall may be provided on the lower partition wall, and an upper width of the upper partition wall may be set wider than a lower width of the upper partition wall. Therefore, an upper surface of the upper partition wall may be provided to hide the separation space between the first partition wall 210 and the bank 530 in a direction in which deposition is performed, and thus, the upper partition wall may act as eaves.

The second partition wall 220 may overlap the first partition wall 210. In detail, the second partition wall 220 may protrude from the second substrate 800 to the first partition wall 210. For example, the second partition wall 220 may be formed in a symmetrical structure about the first partition wall 210 with respect to the filling layer 540. Also, the first partition wall 210 and the second partition wall 220 may face each other with the filling layer 540 therebetween. Therefore, the first partition wall 210 may fix and support a lower portion of the filling layer 540, and the second partition wall 220 may fix and support an upper portion of the filling layer 540, whereby in comparison with a case where only the first partition wall 210 is provided, a stress applied to the organic light emitting device E is more reduced, and a rigidity of the transparent display apparatus is more complemented to enhance the reliability of the transparent display apparatus. As a result, in comparison with a case where only the first partition wall 210 is provided, since the transparent display apparatus according to the present embodiment has a reverse tapered structure and includes the first and second partition walls 210 and 220 facing each other, a stress applied to the transparent display apparatus is more reduced, and a rigidity of the transparent display apparatus is more complemented, thereby enhancing the reliability of the transparent display apparatus.

According to an embodiment, the second partition wall 220 may have a shape which is the same as or different from that of the first partition wall 210. Hereinafter, various shapes of the first partition wall 210 will be described, and the second partition wall 220 may independently have one of the various shapes. Also, the second partition wall 220 may be formed through the same process as the first partition wall 210.

A TFT T may be provided in an emission part EL on the multi-buffer layer 110. The TFT T may include a semiconductor layer 310, a gate insulation layer 320, a gate electrode 330, a first passivation layer 340, a source electrode 350, a drain electrode 360, and a second passivation layer 370.

The semiconductor layer 310 may be provided in the emission part EL of the first substrate 100. The semiconductor layer 310 may be disposed to overlap the gate electrode 330, the source electrode 350, and the drain electrode 360. The semiconductor layer 310 may directly contact the source electrode 350 and the drain electrode 360 and may face the gate electrode 330 with the gate insulation layer 320 therebetween.

According to an embodiment, the semiconductor layer 310 may include a source/drain region 311 and a channel region 312. The channel region 312 may be provided in a center region of the semiconductor layer 310, and the source/drain region 311 may be provided in parallel with the channel region 312 therebetween. The source/drain region 311 may overlap the source electrode 350 and the drain electrode 360, and the channel region 312 may overlap the gate electrode 330.

The gate insulation layer 320 may be provided on the semiconductor layer 310. In detail, the gate insulation layer 320 may be disposed in the channel region 312 of the semiconductor layer 310 and may insulate the semiconductor layer 310 from the gate electrode 330.

The gate electrode 330 may be provided on the gate insulation layer 320. The gate electrode 330 may overlap the channel region 312 of the semiconductor layer 310 with the gate insulation layer 320 therebetween.

According to an embodiment, the gate electrode 330 may include a bottom gate electrode 331 and a top gate electrode 332.

The bottom gate electrode 331 may be provided between the gate insulation layer 320 and the top gate electrode 332 to increase an adhesive force between the gate insulation layer 320 and the top gate electrode 332 and to prevent a lower surface of the top gate electrode 332 from being corroded.

The top gate electrode 332 may be provided on an upper surface of the bottom gate electrode 331. According to an embodiment, a thickness of the top gate electrode 332 may be set thicker than that of the bottom gate electrode 331, and thus, a total resistance of the gate electrode 330 is reduced.

The first passivation layer 340 may be provided on the gate electrode 330. The first passivation layer 340 may protect the TFT T. A corresponding region of the first passivation layer 340 may be removed for bringing the semiconductor layer 310 into contact with the source electrode 350 or the drain electrode 360. For example, the first passivation layer 340 may include a first contact hole, through which the source electrode 350 passes, and a second contact hole through which the drain electrode 360 passes.

The source electrode 350 and the drain electrode 360 may be provided on the first passivation layer 340 and may be spaced apart from each other. The source electrode 350 may contact one end of the source/drain region 311 of the semiconductor layer 310 through the first contact hole provided in the first passivation layer 340, and the drain electrode 360 may contact the other end of the source/drain region 311 of the semiconductor layer 310 through the second contact hole provided in the first passivation layer 340. Also, the source electrode 350 may directly contact the second auxiliary electrode 610 through a third contact hole of the second passivation layer 370 and a fourth contact hole of the first planarization layer 510.

According to an embodiment, the source electrode 350 may include a bottom source electrode 351 and a top source electrode 352.

The bottom source electrode 351 may be provided between the first passivation layer 340 and the top source electrode 352 to increase an adhesive force between the first passivation layer 340 and the top source electrode 352. Also, the bottom source electrode 351 may protect a lower surface of the top source electrode 352, thereby preventing the lower surface of the top source electrode 352 from being corroded.

The top source electrode 352 may be provided on an upper surface of the bottom source electrode 351. The top source electrode 352 may be formed of metal which is relatively lower in resistance than the bottom source electrode 351. A thickness of the top source electrode 352 may be set thicker than that of the bottom source electrode 351, for reducing a total resistance of the source electrode 350.

Similarly to the above-described source electrode 350, the drain electrode 360 may include a bottom drain electrode 361 and a top drain electrode 362.

The bottom drain electrode 361 may be provided between the first passivation layer 340 and the top drain electrode 362 to increase an adhesive force between the first passivation layer 340 and the top drain electrode 362 and to prevent a lower surface of the top drain electrode 362 from being corroded.

The top drain electrode 362 may be provided on an upper surface of the bottom drain electrode 361. The top drain electrode 362 may be formed thicker than the bottom drain electrode 361, thereby reducing a total resistance of the drain electrode 360.

The second passivation layer 370 may be provided on the first passivation layer 340, the source electrode 350, and the drain electrode 360. The second passivation layer 370 may protect the source electrode 350 and the drain electrode 360. The second passivation layer 370 may include the third contact hole through which the second auxiliary electrode 610 passes. Here, the third contact hole of the second passivation layer 370 may be connected to the fourth contact hole of the first planarization layer 510, in order for the second auxiliary electrode 610 to pass through the third contact hole.

The signal pad 410 may be provided on the gate insulation layer 120. The signal pad 410 may be provided on the same layer as the gate electrode 130 provided in the above-described active area AA.

The signal pad 410 may include a bottom signal pad 411 and a top signal pad 412.

The bottom signal pad 411 may be provided between the multi-buffer layer 110 and the top signal pad 412 to increase an adhesive force between the multi-buffer layer 110 and the top signal pad 412. Also, the bottom signal pad 411 may prevent a lower surface of the top signal pad 412 from being corroded.

The top signal pad 412 may be provided on an upper surface of the bottom signal pad 411. In detail, the top signal pad 412 may be formed of metal which is relatively lower in resistance than the bottom signal pad 411. The top signal pad 412 may be formed thicker than the bottom signal pad 411, for reducing a total resistance of the signal pad 410.

The first auxiliary electrode 420 may be provided on the first passivation layer 340. For example, the first passivation layer 340 may further include a fifth contact hole through which the first auxiliary electrode 420 passes. Therefore, the first auxiliary electrode 420 may contact the signal pad 410 through a fifth contact hole provided in the first passivation layer 340. Also, the first auxiliary electrode 420 may contact the pad electrode 430 through a sixth contact hole provided in the second passivation layer 370.

According to an embodiment, the first auxiliary electrode 420 may include a bottom first auxiliary electrode 421 and a top first auxiliary electrode 422.

The bottom first auxiliary electrode 421 may be provided between the first passivation layer 340 and the top first auxiliary electrode 422 to increase an adhesive force between the first passivation layer 340 and the top first auxiliary electrode 422. Also, the bottom first auxiliary electrode 421 may protect a lower surface of the top first auxiliary electrode 422, thereby preventing the lower surface of the top first auxiliary electrode 422 from being corroded.

The top first auxiliary electrode 422 may be provided on an upper surface of the bottom first auxiliary electrode 421. The top first auxiliary electrode 422 may be formed of metal which is relatively lower in resistance than the bottom first auxiliary electrode 421. A thickness of the top first auxiliary electrode 422 may be set thicker than that of the bottom first auxiliary electrode 421, for reducing a total resistance of the first auxiliary electrode 420.

The pad electrode 430 may be provided on the second passivation layer 370. For example, the second passivation layer 370 may further include the sixth contact hole through which the pad electrode 430 passes. Therefore, the pad electrode 430 may contact the first auxiliary electrode 420 through the sixth contact hole provided in the second passivation layer 370.

The pad electrode 430 may include a bottom pad electrode 431, a top pad electrode 432, and a cover pad electrode 433.

The bottom pad electrode 431 may be provided to cover an upper surface of the top first auxiliary electrode 422 exposed through the sixth contact hole of the second passivation layer 370, thereby preventing the top first auxiliary electrode 422 from being corroded. Accordingly, since the bottom pad electrode 431 prevents corrosion of the top first auxiliary electrode 422, the first auxiliary electrode 420 may be provided in a two-layer structure described above.

The top pad electrode 432 may be provided between the bottom pad electrode 431 and the cover pad electrode 433. In detail, the top pad electrode 432 may be formed of metal which is relatively lower in resistance than the bottom pad electrode 431 and the cover pad electrode 433. The top pad electrode 432 may be formed thicker than each of the bottom pad electrode 431 and the cover pad electrode 433, for reducing a total resistance of the pad electrode 430.

The cover pad electrode 433 may be provided on the top pad electrode 432. In detail, the cover pad electrode 433 may prevent the top pad electrode 432 from being exposed at the outside. Therefore, the cover pad electrode 433 may be provided to cover an upper surface and a side surface of the top pad electrode 432, thereby preventing the top pad electrode 432 from being corroded.

Additionally, the cover pad electrode 433 may be provided to cover a side surface of the bottom pad electrode 431. For example, an oxidation rate of the cover pad electrode 433 may be lower than that of the bottom pad electrode 431. Also, the cover pad electrode 433 may be formed of a material which is stronger in corrosion resistance than the bottom pad electrode 431.

The storage capacitor 440 may include a first capacitor electrode and a second capacitor electrode. In detail, the storage capacitor 440 may include the first and second capacitor electrodes which face each other with the first passivation layer 340 therebetween.

The first capacitor electrode may include a bottom first capacitor electrode 441 and a top first capacitor electrode 442.

The bottom first capacitor electrode 441 may be provided between the multi-buffer layer 110 and the top first capacitor electrode 442 to increase an adhesive force between the multi-buffer layer 110 and the top first capacitor electrode 442. Also, the bottom first capacitor electrode 441 may prevent a lower surface of the top first capacitor electrode 442 from being corroded.

The top first capacitor electrode 442 may be provided on an upper surface of the bottom first capacitor electrode 441. In detail, the top first capacitor electrode 442 may be formed of metal which is relatively lower in resistance than the bottom first capacitor electrode 441. The top first capacitor electrode 442 may be formed thicker than the bottom first capacitor electrode 441, for reducing a total resistance of the first capacitor electrode.

The second capacitor electrode may include a bottom second capacitor electrode 443 and a top second capacitor electrode 444.

The bottom second capacitor electrode 443 may be provided between the first passivation layer 340 and the top second capacitor electrode 444 to increase an adhesive force between the first passivation layer 340 and the top second capacitor electrode 444. Also, the bottom second capacitor electrode 443 may prevent a lower surface of the top second capacitor electrode 444 from being corroded.

The top second capacitor electrode 444 may be provided on an upper surface of the bottom second capacitor electrode 443. In detail, the top second capacitor electrode 444 may be formed of metal which is relatively lower in resistance than the bottom second capacitor electrode 443. The top second capacitor electrode 444 may be formed thicker than the bottom second capacitor electrode 443, for reducing a total resistance of the second capacitor electrode.

The planarization layer 500 may be provided on the TFT T and may planarize an upper end of the TFT T. According to an embodiment, the planarization layer 500 may include a first planarization layer 510 and a second planarization layer 520.

The first planarization layer 510 may be provided on the TFT T and may planarize the upper end of the TFT T. The second auxiliary electrode 610 and the third auxiliary electrode 650 may be provided on an upper end of the first planarization layer 510 and may be spaced apart from each other. For example, the first planarization layer 510 may include the fourth contact hole through which the second auxiliary electrode 610 passes. Here, the fourth contact hole of the first planarization layer 510 may be connected to the third contact hole of the second passivation layer 370, in order for the second auxiliary electrode 610 to pass through the fourth contact hole.

The second planarization layer 520 may be provided on the first planarization layer 510, the second auxiliary electrode 610, and the third auxiliary electrode 650 and may planarize an upper end of each of the first planarization layer 510, the second auxiliary electrode 610, and the third auxiliary electrode 650. Also, the second planarization layer 520 may protect the second auxiliary electrode 610 and the third auxiliary electrode 650. For example, the second planarization layer 520 may include a seventh contact hole through which the anode electrode 620 passes. Additionally, the second planarization layer 520 may include an eighth contact hole through which the fourth auxiliary electrode 660 passes.

The bank 530 may be provided on the planarization layer 500. The bank 530 may be provided between adjacent anode electrodes 620 and may divide the adjacent anode electrodes 620. Therefore, the bank 530 may electrically insulate the adjacent anode electrodes 620.

The filling layer 540 may be filled into a space between the first substrate 100 and the second substrate 800. The filling layer 540 may be disposed between the first substrate 100 and the second substrate 800 to prevent the loss of light and to increase an adhesive force between the first substrate 100 and the second substrate 800. Also, in a case where each of the first substrate 100 and the second substrate 800 is implemented as a transparent flexible substrate, the filling layer 540 may reduce a stress occurring in the display panel.

The organic light emitting device E may be provided on the planarization layer 500 and may be electrically connected to the TFT T. The organic light emitting device E may include the second auxiliary electrode 610, the anode electrode 620, the organic light emitting layer 630, the cathode electrode 640, the third auxiliary electrode 650, and the fourth auxiliary electrode 660.

The second auxiliary electrode 610 may be provided on the first planarization layer 510 and may be electrically connected to the source electrode 350 of the TFT T. The second auxiliary electrode 610 may contact the source electrode 350 of the TFT T through the fourth contact hole provided in the first planarization layer 510.

The second auxiliary electrode 610 may include a bottom second auxiliary electrode 611, a top second auxiliary electrode 612, and a cover second auxiliary electrode 613.

The bottom second auxiliary electrode 611 may be provided to cover an upper surface of the source electrode 350 exposed through the fourth contact hole of the first planarization layer 510, thereby preventing corrosion of the source electrode 350.

The top second auxiliary electrode 612 may be provided between the bottom second auxiliary electrode 611 and the cover second auxiliary electrode 613. According to an embodiment, the top second auxiliary electrode 612 may be formed of metal which is relatively lower in resistance than the bottom second auxiliary electrode 611 and the cover second auxiliary electrode 613. A thickness of the top second auxiliary electrode 612 may be set thicker than that of each of the bottom second auxiliary electrode 611 and the cover second auxiliary electrode 613, for reducing a total resistance of the second auxiliary electrode 610.

The cover second auxiliary electrode 613 may be provided on the top second auxiliary electrode 612. In detail, the cover second auxiliary electrode 613 may prevent the top second auxiliary electrode 612 from being exposed at the outside. Therefore, the cover second auxiliary electrode 613 may be provided to cover an upper surface and a side surface of the top second auxiliary electrode 612, thereby preventing the top second auxiliary electrode 612 from being corroded.

Additionally, the cover second auxiliary electrode 613 may be provided to cover a side surface of the bottom second auxiliary electrode 611. For example, an oxidation rate of the cover second auxiliary electrode 613 may be lower than that of the bottom second auxiliary electrode 611. Also, the cover second auxiliary electrode 613 may be formed of a material which is stronger in corrosion resistance than the bottom second auxiliary electrode 611.

The anode electrode 620 may be provided on the second planarization layer 520 and may be electrically connected to the second auxiliary electrode 610. Therefore, the anode electrode 620 may be electrically connected to the source electrode 350 of the TFT T by using the second auxiliary electrode 610. The anode electrode 620 may be electrically connected to the source electrode 350 through the second auxiliary electrode 610, and thus, when the transparent display apparatus is implemented as a large-size display apparatus, signals and power may be easily transferred between elements in all of a plurality of pixel areas. Also, the anode electrode 620 may contact the second auxiliary electrode 610 through the seventh contact hole provided in the second planarization layer 520.

The organic light emitting layer 630 may be provided on the anode electrode 620. The organic light emitting layer 630 may be provided in common in all of a plurality of pixels without being individually provided in each of the plurality of pixel areas. According to an embodiment, the organic light emitting layer 630 may include a hole transporting layer, an organic light emitting layer, and an electron transporting layer. According to an embodiment, the organic light emitting layer 630 may further include at least one function layer for enhancing the emission efficiency and lifetime of a light emitting layer.

The cathode electrode 640 may be provided on the organic light emitting layer 630. The cathode electrode 640 may be implemented in an electrode form provided in common in all of the pixels without being individually provided in each of the plurality of pixel areas. That is, the cathode electrode 640 may be provided on the bank 530 as well as the organic light emitting layer 630.

The third auxiliary electrode 650 may be provided on the first planarization layer 510 and may be electrically connected to the fourth auxiliary electrode 660. The third auxiliary electrode 650 may contact the fourth auxiliary electrode 660 through the eighth contact hole provided in the second planarization layer 520.

The third auxiliary electrode 650 may include a bottom third auxiliary electrode 651, a top third auxiliary electrode 652, and a cover third auxiliary electrode 653.

The bottom third auxiliary electrode 651 may be provided on a flat surface of the first planarization layer 510. Also, an oxidation rate of the bottom third auxiliary electrode 651 may be lower than that of the top third auxiliary electrode 652.

The top third auxiliary electrode 652 may be provided between the bottom third auxiliary electrode 651 and the cover third auxiliary electrode 653. According to an embodiment, the top third auxiliary electrode 652 may be formed of metal which is relatively lower in resistance than the bottom third auxiliary electrode 651 and the cover third auxiliary electrode 653. The top third auxiliary electrode 652 may be formed thicker than each of the bottom third auxiliary electrode 651 and the cover third auxiliary electrode 653, for reducing a total resistance of the third auxiliary electrode 650.

The cover third auxiliary electrode 653 may be provided on the top third auxiliary electrode 652. In detail, the cover third auxiliary electrode 653 may prevent the top third auxiliary electrode 652 from being exposed at the outside. Therefore, the cover third auxiliary electrode 653 may be provided to cover an upper surface and a side surface of the top third auxiliary electrode 652, thereby preventing the top third auxiliary electrode 652 from being corroded.

Additionally, the cover third auxiliary electrode 653 may be provided to cover a side surface of the bottom third auxiliary electrode 651. For example, an oxidation rate of the cover third auxiliary electrode 653 may be lower than that of the bottom third auxiliary electrode 651. Also, the cover third auxiliary electrode 653 may be formed of a material which is stronger in corrosion resistance than the bottom third auxiliary electrode 651.

The fourth auxiliary electrode 660 may be provided on the second planarization layer 520 and may be electrically connected to the third auxiliary electrode 650. In detail, the fourth auxiliary electrode 660 may contact the third auxiliary electrode 650 through the eighth contact hole provided in the second planarization layer 520. Also, the fourth auxiliary electrode 660 may be electrically connected to a plurality of source electrodes 640 divided by the partition wall 200. The fourth auxiliary electrode 660 may be electrically connected to the plurality of source electrodes 640 divided by the partition wall 200, and thus, when the transparent display apparatus is implemented as a large-size display apparatus, the signals and the power may be easily transferred between the elements in all of the plurality of pixel areas.

The color filter 710 may be disposed between the filling layer 540 and the second substrate 800. The color filter 710 may be disposed on the organic light emitting device E and may convert a color of white light emitted from the organic light emitting device E. For example, the color filter 710 may include a red color filter, a green color filter, and a blue color filter. Therefore, a red subpixel, a green subpixel, and a blue subpixel of a plurality of subpixels SP may include the color filter 710, and a white subpixel may be implemented without a color filter.

The black matrix 720 may be disposed between the filing layer 540 and the second substrate 800. The black matrix 720 may be disposed on each of both sides of the color filter 710 not to overlap the organic light emitting device E and may prevent light from being leaked to a non-display area NDA, thereby preventing light leakage and preventing visibility from being reduced.

The second substrate 800 may be provided on a whole upper end of the filling layer 540. The second substrate 800 may be disposed on the first substrate 100 so as to prevent external water or air from penetrating into the TFT T and the organic light emitting device E provided on the first substrate 100. According to an embodiment, the second substrate 800 may be disposed to face the first substrate 100, and the first substrate 100 may be bonded to the second substrate 800 by the filling layer 540 and a sealing member (not shown) disposed along an edge of the filling layer 540. For example, the second substrate 800 may be a glass substrate or a plastic substrate.

Figure 5:
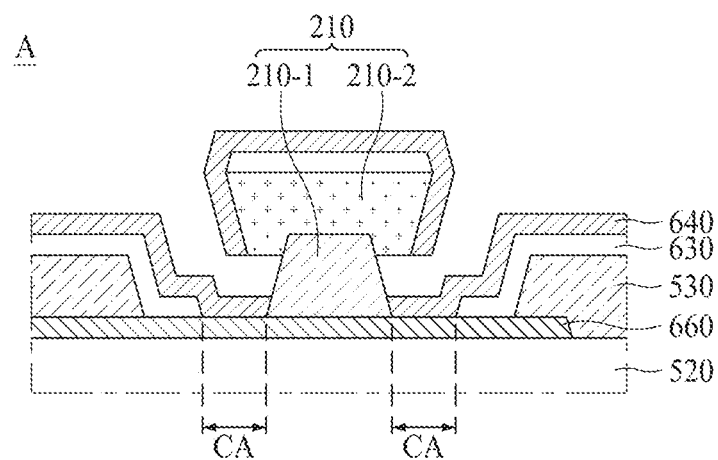
FIG. 5 is a cross-sectional view illustrating a first partition wall in a transparent display apparatus according to an embodiment of the present disclosure.

FIG. 5 is a cross-sectional view illustrating the first partition wall 210 in the transparent display apparatus according to an embodiment of the present disclosure.

Referring to FIGS. 4 and 5 together, the first partition wall 210 may be disposed on the second planarization layer 520 and may protrude to the second substrate 800. For example, after a deposition of the fourth auxiliary electrode 660 is completed, the first partition wall 210 may be provided on the fourth auxiliary electrode 660. Also, after the first partition wall 210 is formed, the organic light emitting layer 630 and the cathode electrode 640 may be sequentially stacked on the upper surface of the first partition wall 210. At this time, the first partition wall 210 may have a reverse tapered structure where an upper width is wider than a lower width and may protrude from the fourth auxiliary electrode 660 to the second substrate 800, and thus, the organic light emitting layer 630 and the cathode electrode 640 provided in each of a plurality of pixel areas adjacent to each other may be separated from each other by the first partition wall 210. Therefore, in the transparent display apparatus according to the present embodiment, the organic light emitting layer 630 and the cathode electrode 640 may be easily patterned without a separate mask process.

According to an embodiment, the organic light emitting layer 630 and the cathode electrode 640 provided in each of the plurality of pixel areas may be separated from each other by the first partition wall 210 having the reverse tapered structure. In this case, the cathode electrode 640 may surround an upper surface and a side surface of each of the first partition wall 210 and the organic light emitting layer 630. Also, the first partition wall 210 may be spaced apart from the bank 530 by a certain distance, and the fourth auxiliary electrode 660 may contact the cathode electrode 640 through a separation space CA between the first partition wall 210 and the bank 530. Therefore, a plurality of source electrodes 640 divided by the first partition wall 210 may be electrically connected to the fourth auxiliary electrode 660. As a result, the fourth auxiliary electrode 660 may be electrically connected to the plurality of source electrodes 640 divided by the partition wall 200, and thus, when the transparent display apparatus is implemented as a large-size display apparatus, electrical connections between the elements in all of the plurality of pixel areas are complemented, whereby the signals and the power may be easily transferred between the elements in all of the plurality of pixel areas.

In detail, when the organic light emitting layer 630 is being deposited, the upper surface of the first partition wall 210 may act as eaves, and the first partition wall 210 may prevent the organic light emitting layer 630 from being deposited in a region CA under the eaves. Therefore, when the upper surface of the first partition wall 210 is disposed to overlap the separation space CA between the first partition wall 210 and the bank 530, the organic light emitting layer 630 may not penetrate into the separation space CA between the first partition wall 210 and the bank 530, and the fourth auxiliary electrode 660 may be exposed through the separation space CA between the first partition wall 210 and the bank 530. Here, the organic light emitting layer 630 may be formed through a deposition process where a linearity of a deposition material is good like an evaporation process, the organic light emitting layer 630 may not be deposited in the separation space CA between the first partition wall 210 and the bank 530 through the deposition process. As a result, in the transparent display apparatus according to the present embodiment, since the first partition wall 210 is provided, the organic light emitting layer 630 and the cathode electrode 640 may be formed so as to be separated from each other in each of the plurality of pixel areas without a separate mask process.

Moreover, the first partition wall 210 may be formed so that the upper width of the first partition wall 210 is wider than the lower width of the first partition wall 210, in order to act as eaves. According to an embodiment, the first partition wall 210 may include a lower partition wall 210-1 and an upper partition wall 210-2. The lower partition wall 210-1 may be provided on the fourth auxiliary electrode 660 and may be formed of the same material as that of the bank 530 through the same process. The upper partition wall 210-2 may be provided on the lower partition wall 210-1, and an upper width of the upper partition wall 210-2 may be set wider than a lower width of the upper partition wall 210-2. Therefore, an upper surface of the upper partition wall 210-2 may be provided to hide the separation space CA between the first partition wall 210 and the bank 530 in a direction in which deposition is performed, and thus, the upper partition wall 210-2 may act as eaves.

FIGS. 6A to 6D are cross-sectional views illustrating an additional embodiment of a first partition wall in a transparent display apparatus according to an embodiment of the present disclosure.

Figure 6A:
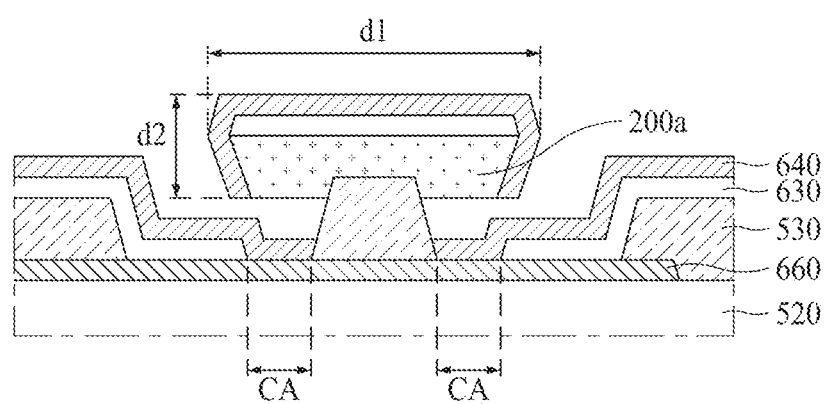
FIGS. 6A to 6D are cross-sectional views illustrating an additional embodiment of a first partition wall in a transparent display apparatus according to an embodiment of the present disclosure.
Figure 6B:
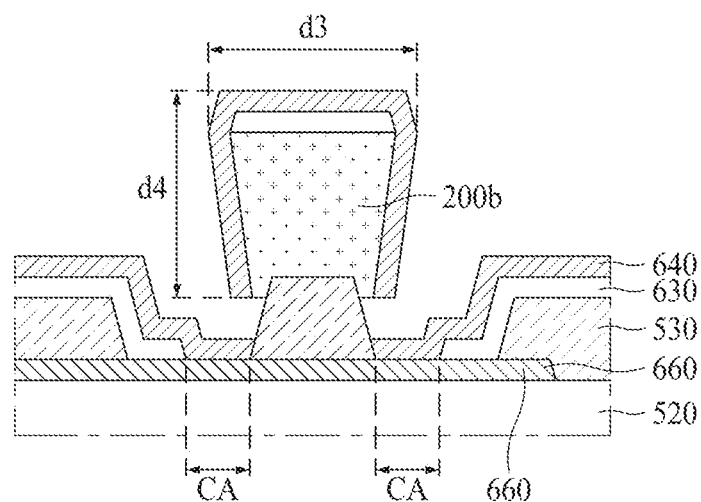

Referring to FIGS. 6A and 6B, the partition wall 200 may have a reverse tapered structure where an upper width is wider than a lower width. Also, the partition wall 200 may include a first axis partition wall 200a and a second axis partition wall 200b, which have different widths and heights.

The first axis partition wall 200a may extend in the first direction X of the first substrate 100 and may be spaced apart from an adjacent first axis partition wall 200a in the second direction Y perpendicularly intersecting the first direction X. According to an embodiment, an upper width d1 of the first axis partition wall 200a may be wider than an upper width d3 of the second axis partition wall 200b. Also, a height d2 of the first axis partition wall 200a may be lower than a height d4 of the second axis partition wall 200b. Also, the second axis partition wall 200b may extend in the second direction Y and may be spaced apart from an adjacent second axis partition wall 200b in the first direction X. According to an embodiment, the upper width d3 of the second axis partition wall 200b may be narrower than the upper width d1 of the first axis partition wall 200a. Also, the height d4 of the second axis partition wall 200b may be higher than the height d2 of the first axis partition wall 200a. For example, in the transparent display apparatus according to the present embodiment, a length of the first direction X may be set longer than that of the second direction Y, and the transparent flexible substrate may be used, whereby the transparent display apparatus may be rolled or bent. Generally, when the transparent display apparatus is rolled or bent in the second direction Y, a stress occurs in the display panel along the second direction Y. Accordingly, since the first axis partition wall 200a is provided wider in width than and lower in height than the second axis partition wall 200b and the second axis partition wall 200b is provided narrower in width than and higher in height than the first axis partition wall 200a, a stress occurring when the transparent display apparatus is rolled or bent is reduced, and thus, rigidity is complemented, thereby preventing the peeling of the organic light emitting device. As a result, the width d1 and the height d2 of the first axis partition wall 200a and the width d3 and the height d4 of the second axis partition wall 200b may be adjusted in the partition wall 200, and thus, stresses which are applied to the transparent display apparatus in various directions are reduced, thereby more complementing rigidity.

For example, in the transparent display apparatus according to the present embodiment, when a length of the first direction X is set longer than that of the second direction Y, the upper width d3 of the second axis partition wall 200b may be narrower than the upper width d1 of the first axis partition wall 200a, and the height d4 of the second axis partition wall 200b may be higher than the height d2 of the first axis partition wall 200a, thereby complementing a rigidity of the transparent display apparatus.

Figure 6C:
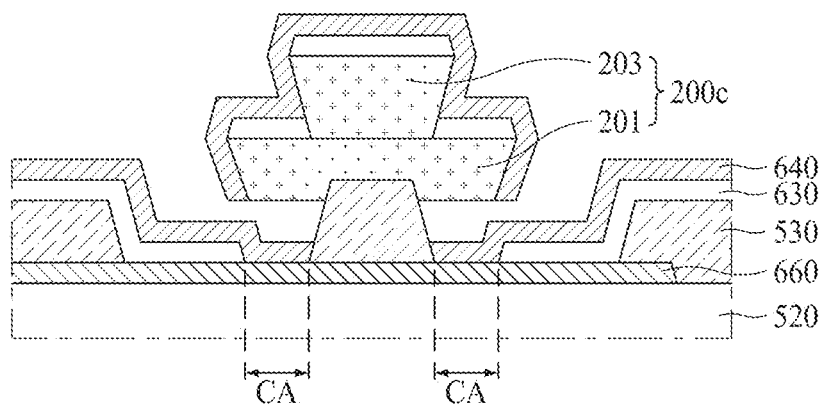

Referring to FIG. 6C, a partition wall 200c may include a lower partition wall and an upper partition wall, and the upper partition wall may include a base partition wall 201 and a protrusion partition wall 203. In detail, the lower partition wall may be provided on the fourth auxiliary electrode 660 and may be formed of the same material as that of the bank 530 through the same process. The base partition wall 201 may be provided on the lower partition wall, and an upper width of the base partition wall 201 may be formed wider than a lower width of the base partition wall 201. Also, the protrusion partition wall 203 may be provided on the base partition wall 201 and may be implemented in a reverse tapered structure having a width which is narrower than that of the base partition wall 201. As described above, the upper partition wall may be configured in a double reverse tapered structure including the base partition wall 201 and the protrusion partition wall 203, and thus, in comparison with the partition wall illustrated in FIGS. 6A and 6B, a contact area and a frictional area with the filling layer 540 increases, thereby stably supporting the filling layer 540 and more complementing a rigidity of the transparent display apparatus to enhance reliability.

Figure 6D:
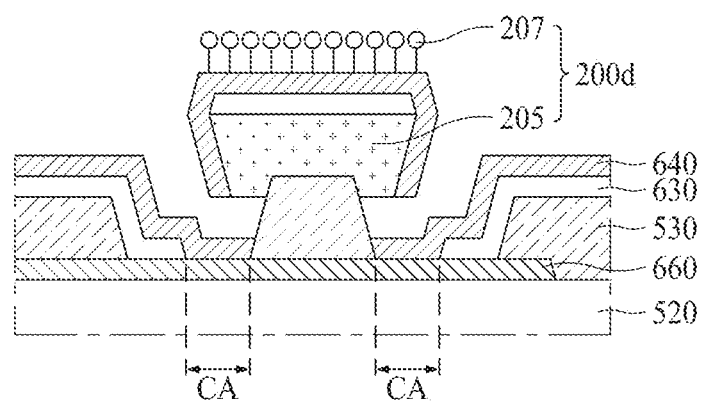

Referring to FIG. 6D, in a partition wall 200d, a functional group 207 may be formed on an upper surface of an upper partition wall 205 through plasma treatment and chemical surface treatment. Here, in the functional group 207, a functional group such as —OH may be formed by activating a partition wall surface molecule through plasma treatment, and thus, surface energy increases. Alternatively, a molecule of a hydrophilic functional group such as —F may be substituted or attached on a surface through chemical surface treatment, thereby increasing an affinitive force with a filling layer 540. Accordingly, in the partition wall 200d, since the functional group 207 is formed on the upper surface of the upper partition wall 205 to increase an adhesive force and a frictional force with the filling layer 540, thereby stably supporting the filling layer 540 and more complementing a rigidity of the transparent display apparatus to enhance reliability.

Figure 7:
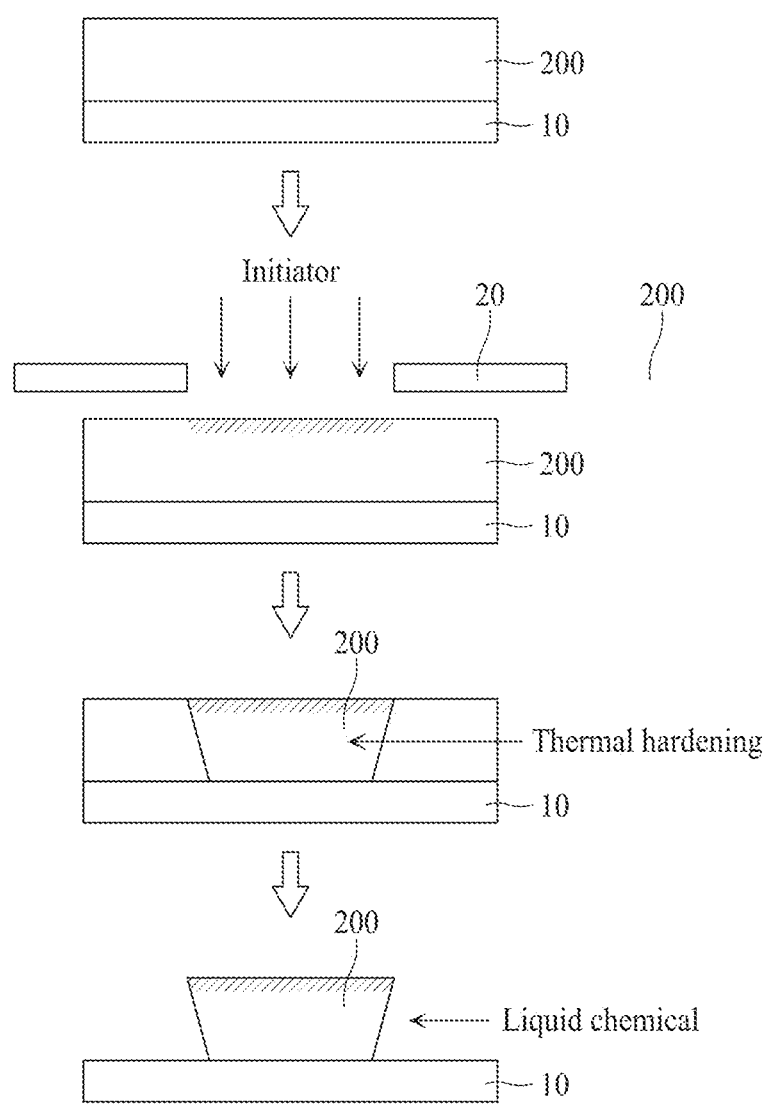
FIG. 7 is a diagram for describing a process of forming a partition wall in a transparent display apparatus according to an embodiment of the present disclosure.

FIG. 7 is a diagram for describing a process of forming a partition wall in a transparent display apparatus according to an embodiment of the present disclosure.

Referring to FIG. 7, a material 200 of a partition wall may be provided on an arbitrary substrate 10. For example, the material 200 of the partition wall may be implemented with a negative photoresist. A partial region of the negative photoresist may be exposed at an initiator or a polymerization initiator through a mask 20. A region exposed at the polymerization initiator may be hardened in a reverse tapered shape through a thermal hardening process. Finally, a portion of the partition wall, besides the portion having the reverse tapered shape, may be removed through a liquid chemical penetration process. Accordingly, the partition wall may have the reverse tapered shape through the liquid chemical penetration process.

As a result, in the transparent display apparatus according to the present disclosure, a partition wall may surround each of a plurality of pixel areas to decrease a stress applied to a display panel and to prevent the peeling of an organic light emitting device and the transmission of water from being spread, thereby enhancing reliability of the display panel. Also, in the transparent display apparatus according to the present disclosure, a rigidity of the transparent display apparatus is complemented by using first and second partition walls each having a reverse tapered structure. Also, Moreover, in the transparent display apparatus according to the present disclosure, since the partition wall surrounds each of the plurality of pixel areas, the organic light emitting device may be patterned without adding a mask, and the peeling of the organic light emitting device may be prevented and the dark spots are prevented from being spread in the display panel, thereby minimizing the defect of each pixel.

As described above, in the transparent display apparatus according to the embodiments of the present disclosure, a partition wall may surround each of a plurality of pixel areas to decrease a stress applied to a display panel and to prevent the peeling of an organic light emitting device and transmission of water from being spread, thereby enhancing a reliability of the display panel.

Moreover, in the transparent display apparatus according to the embodiments of the present disclosure, a rigidity of the transparent display apparatus is complemented by using first and second partition walls each having a reverse tapered structure.

Moreover, in the transparent display apparatus according to the embodiments of the present disclosure, since the partition wall surrounds each of the plurality of pixel areas, the organic light emitting device may be patterned without adding a mask, and peeling and dark spots are prevented from being spread, thereby minimizing the defect of each pixel.

It will be apparent to those skilled in the art that various modifications and variations can be made to the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus, comprising:
a first substrate;
a plurality of unit pixels each including a plurality of subpixels provided in an emission part of the first substrate and a transmission part adjacent to the plurality of subpixels;
a partition wall surrounding at least one of the plurality of subpixels and the transmission part;
a filling layer covering the partition wall and the plurality of unit pixels; and
a second substrate coupled to the filling layer,
wherein the partition wall includes:
a first partition wall disposed on the first substrate; and
a second partition wall disposed on the second substrate,
wherein the first partition wall has an upper portion and a lower portion,
wherein the second partition wall has an upper portion disposed to face the upper portion of the first partition wall and a lower portion provided on a side of the second substrate,
wherein the first partition wall and the second partition wall are disposed to face each other with the filling layer therebetween, and
wherein the first partition wall has a reverse tapered structure in which a width of the upper portion of the first partition wall is wider than a width of the lower portion of the first partition wall provided on a side of the first substrate.

2. The transparent display apparatus of claim 1, wherein the partition wall surrounds each of the plurality of unit pixels.

3. The transparent display apparatus of claim 2, wherein the plurality of unit pixels comprise a first unit pixel and a second unit pixel adjacent to each other in a first direction, and
the partition wall is disposed between the transmission part of the first unit pixel and a plurality of subpixels of the second unit pixel.

4. The transparent display apparatus of claim 1, wherein the partition wall surrounds each of the plurality of subpixels.

5. The transparent display apparatus of claim 4, wherein the plurality of unit pixels comprise a first unit pixel and a second unit pixel adjacent to each other in a first direction, and
the transmission part of the first unit pixel is disposed between the partition wall surrounding each of the plurality of subpixels of the first unit pixel and the partition wall surrounding each of the plurality of subpixels of the second unit pixel.

6. The transparent display apparatus of claim 1, wherein the partition wall respectively surrounds the transmission part and each of the plurality of subpixels.

7. The transparent display apparatus of claim 6, wherein the plurality of unit pixels comprise a first unit pixel and a second unit pixel adjacent to each other in a first direction and a third unit pixel adjacent to the first unit pixel in a second direction, and
a transmission part of the first unit pixel is disposed between the partition wall surrounding each of a plurality of subpixels of the first unit pixel and the partition wall surrounding each of a plurality of subpixels of the second unit pixel and is separated from a transmission part of the third unit pixel by a partition wall surrounding an upper end of the transmission part of the third unit pixel.

8. The transparent display apparatus of claim 1, wherein the second partition wall partially overlaps the first partition wall.

9. The transparent display apparatus of claim 8, wherein the second partition wall protrudes from the second substrate towards the first partition wall.

10. The transparent display apparatus of claim 8, wherein at least one of the first partition wall and the second partition wall comprises:
a first axis partition wall extending in a first direction of the first substrate; and
a second axis partition wall extending in a second direction perpendicularly intersecting the first direction.

11. The transparent display apparatus of claim 10, wherein an upper width of the first axis partition wall is wider than an upper width of the second axis partition wall, and a height of the second axis partition wall is higher than a height of the first axis partition wall.

12. The transparent display apparatus of claim 8, wherein a functional group is provided on an upper surface of at least one of the first partition wall and the second partition wall through plasma treatment and chemical surface treatment.

13. The transparent display apparatus of claim 8, further comprising:
a thin film transistor provided in the emission part;

a planarization layer provided on the thin film transistor to planarize an upper end of the thin film transistor; and an organic light emitting device provided on the planarization layer and electrically connected to the thin film transistor.

14. The transparent display apparatus of claim 13, wherein the organic light emitting device comprises:
an auxiliary electrode connected to a source electrode of the thin film transistor;
an anode electrode connected to the auxiliary electrode;
an organic light emitting layer provided on the anode electrode; and
a cathode electrode provided in the emission part and the transmission part, on the organic light emitting layer.

15. The transparent display apparatus of claim 14, wherein the organic light emitting layer and the cathode electrode are provided in each of a plurality of adjacent pixel areas which are separated from each other by the first partition wall.

16. A transparent display apparatus, comprising:
a first substrate having an emission area and a transmission area adjacent to the emission area;
a plurality of unit pixels each including a plurality of subpixels provided in the emission area of the first substrate;
a first partition wall adjacent to at least one of the plurality of subpixels and the transmission part, the first partition wall on the first substrate;
a second substrate facing the first substrate;
a second partition wall on the second substrate and facing the first partition wall, the second partition wall having a first portion and a second portion, the second portion being between the first portion and the second substrate;
a filling layer between the first substrate and the second substrate,
wherein the first portion of the second partition wall has a reverse tapered structure and the second portion of the second partition wall has a dimension that becomes wider as it protrudes towards the second substrate,
wherein the filling layer is between the first portion of the second partition wall and the first partition wall.

17. A transparent display apparatus, comprising:
a first substrate having an emission area and a transmission area adjacent to the emission area;
a plurality of unit pixels each including a plurality of subpixels provided in the emission area of the first substrate;
a second substrate facing the first substrate;
a first partition wall on the first substrate, the first partition wall adjacent to at least one of the plurality of subpixels and the transmission part, the first partition wall including:
a first portion on the first substrate and extending towards the second substrate; and
a second portion on the first portion, the second portion having a dimension that increases as it gets closer to the second substrate,
a second partition wall on the second substrate, the second partition wall including:
a first portion on the second substrate and extending towards the first substrate; and
a second portion on the first portion, the second portion having a dimension that increases as it gets closer to the first substrate,
a filling layer between the first substrate and the second substrate,
wherein the filling layer is between the second portion of the first partition wall and the second portion of the second partition wall.

* * * * *